United States Patent
Gruber et al.

(10) Patent No.: US 6,708,873 B2
(45) Date of Patent: Mar. 23, 2004

(54) APPARATUS AND METHOD FOR FILLING HIGH ASPECT RATIO VIA HOLES IN ELECTRONIC SUBSTRATES

(75) Inventors: Peter A. Gruber, Mohegan Lake, NY (US); Frederic Maurer, Valhalla, NY (US); Lubomyr Taras Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/191,378

(22) Filed: Jul. 8, 2002

(65) Prior Publication Data

US 2002/0175438 A1 Nov. 28, 2002

Related U.S. Application Data

(62) Division of application No. 09/383,325, filed on Aug. 26, 1999, now Pat. No. 6,461,136.

(51) Int. Cl.[7] .................... B23K 31/02; B05D 5/00
(52) U.S. Cl. ................ 228/256; 228/33; 228/248.1; 228/260; 118/50; 118/213; 222/591; 427/97
(58) Field of Search .............. 228/248.1, 248.5, 228/256, 260, 33, 37; 425/110, 546, 129.1, 13; 118/213, 301, 50; 427/97, 294, 295; 222/591, 594, 595

(56) References Cited

U.S. PATENT DOCUMENTS 3,652,075 A * 3/1972 Thompson ............. 269/21
4,954,313 A * 9/1990 Lynch .................... 419/9
4,959,246 A * 9/1990 Cleemput ............... 427/97

(List continued on next page.)

FOREIGN PATENT DOCUMENTS

JP 401236694 A * 9/1989
JP 406039998 A * 2/1994

OTHER PUBLICATIONS

U.S. patent application Ser. No. 2001/0027842A1 Curcio et al. (Oct. 11, 2001).*
U.S. patent application Ser. No. 2002/0009536A1 Iguchi et al. (Jan. 24, 2002).*
U.S. patent application Ser. No. 2002/0175438A1 Gruber et al. (Nov. 28, 2002).*
U.S. patent application Ser. No. 2001/0179335A1 Curcio et al. (Dec. 5, 2002).*

Primary Examiner—Kiley Stoner
(74) Attorney, Agent, or Firm—Robert M. Trepp; Randy W. Tung

(57) ABSTRACT

An apparatus and a method for filling high aspect ratio holes in electronic substrates that can be advantageously used for filling holes having aspect ratios larger than 5:1 are disclosed. In the apparatus, a filler plate and a vacuum plate are used in conjunction with a connection means such that a gap is formed between the two plates to accommodate an electronic substrate equipped with high aspect ratio via holes. The filler plate is equipped with an injection slot while the vacuum plate is equipped with a vacuum slot such that when a substrate is sandwiched therein, via holes can be evacuated of air and injected with a liquid simultaneously from a bottom side and a top side of the substrate. The present invention novel apparatus and method allows the filling of via holes that have small diameters, i.e., as small as 10 μm, and high aspect ratios, i.e., at least 5:1 to be filled with an electrically conductive material such as a solder or a conductive polymer such that vias or interconnects can be formed in electronic substrates. The present invention apparatus and method can be advantageously used in fabricating substrates for display panels by forming conductive vias and interconnects for placing a voltage potential on pixel display elements formed on the display panels.

21 Claims, 5 Drawing Sheets

U.S. PATENT DOCUMENTS

| | | | |
|---|---|---|---|
| 5,059,112 A | * 10/1991 | Wieser | 425/546 |
| 5,244,143 A | 9/1993 | Ference et al. | |
| 5,339,536 A | * 8/1994 | Buttars | 33/613 |
| 5,388,327 A | 2/1995 | Trabucco | |
| 5,565,033 A | 10/1996 | Gaynes et al. | |
| 5,673,846 A | 10/1997 | Gruber | |
| 5,718,361 A | 2/1998 | Braun et al. | |
| 5,744,171 A | 4/1998 | Schneider | |
| 5,971,058 A | 10/1999 | Bolde et al. | |
| 5,982,038 A | 11/1999 | Toy et al. | |
| 6,029,882 A | 2/2000 | Bolde et al. | |
| 6,191,709 B1 | 2/2001 | Cho | |
| 6,231,333 B1 | 5/2001 | Gruber et al. | |
| 6,276,596 B1 | 8/2001 | Gruber et al. | |
| 6,312,621 B1 | * 11/2001 | Pedigo et al. | 252/500 |
| 6,378,762 B1 | * 4/2002 | Takeuchi et al. | 228/248.1 |
| 6,425,750 B1 | * 7/2002 | Yoon | 425/110 |
| 6,452,117 B2 | * 9/2002 | Curcio et al. | 174/262 |
| 6,461,136 B1 | * 10/2002 | Gruber et al. | 425/110 |
| 6,581,280 B2 | * 6/2003 | Curcio et al. | 29/832 |
| 6,598,292 B1 | * 7/2003 | Segawa et al. | 29/852 |

* cited by examiner

APPARATUS AND METHOD FOR FILLING HIGH ASPECT RATIO VIA HOLES IN ELECTRONIC SUBSTRATES

This is a divisional of application(s) Ser. No. 09/383,325 filed on Aug. 26, 1999 now U.S. Pat. No. 6,461,136.

FIELD OF THE INVENTION

The present invention generally relates to an apparatus and a method for filling holes in a substrate and more particularly, relates to an apparatus and a method for filling holes in electronic substrates that have high aspect ratios of at least 5:1 in a process for forming vias and interconnects.

BACKGROUND OF THE INVENTION

In the electronics packaging industry, there is often a need to fill holes in various substrates for forming vias and interconnects. The hole filling process is affected by a number of processing and material parameters, for instance, the diameter of the via hole, the depth of the hole and the type of the substrate material, etc. Typically, via holes are through holes and are used to electrically connect a top surface and a bottom surface of a substrate, the filler material utilized in forming the vias must be electrically conductive. A number of techniques have been used to perform the via hole filling process. Depending on the type of the substrate, the techniques may include electroplating, electroless plating, solder paste screen printing and conductive paste screen printing.

A fundamental processing problem arises when the depth-to-width ratio, or the aspect ratio grows. The problem gets more complex when the hole diameter is made aggressively small, i.e., 125 µm or less. For instance, for holes having depth-to-width aspect ratios of 5:1 or larger, it is no longer possible to use a conventional technique such as paste screening to fill the holes. Even the more advanced plating techniques cannot be used when diameters further decrease and aspect ratios further increase.

An attempt to fill via holes that have 17:1 aspect ratio with conductive epoxies by a screen printing method was found ineffective, even when the screening process is conducted from both the top and the bottom side of the substrate. One other attempt to fill a glass substrate that has via holes of 17:1 aspect ratio was carried out by utilizing a conductive material that has extremely low viscosity, i.e., an eutectic solder that has a viscosity of only 2 centipoise in its molten state, approaching that of water. Even at such low viscosity, known techniques for filling the high aspect ratio via holes were found ineffective. For instance, the conventional techniques tried include an injection molded solder technique with only pressure utilized. The injection molded solder technique was not able to fill deep vias holes that have very small diameters, i.e., smaller than 25 µm.

A second technique of vacuum injection molding was also tried. A graphic illustration of the vacuum injection molding process is shown in FIGS. 1A~1D. The vacuum injection molding process was disclosed in a co-pending application that was assigned to the common assignee of the present invention under Ser. No. 08/518,874. The vacuum injection molding method utilizes a pressure differential formed between either ambient and vacuum or positive pressure and vacuum. The pressure and the vacuum are both supplied on the same surface of a substrate 10, as shown in FIG. 1A. The process is carried out by utilizing a shallow vacuum link 12 that allows a continual evacuation of air from via holes 20 that have a large aspect ratio such as 5:1. The vacuum link 12 must be sufficiently shallow such that the surface tension of molten solder prevents cross-leaking during the operation. Such a shallow link 12 effectively choke a significant part of the full pressure differential and thus producing only partial filling of via holes 20 that have high aspect ratios.

As shown in FIG. 1A, an injection head 14 which includes spaced apart vacuum slot 16 and injection slot 22 is positioned on top of a mold plate, or substrate 10 in fluid communication with the mold cavities, or via holes 20 contained therein. Relative axial sliding is effected between the injection head 14 and the mold plate 10 for sequentially evacuating gas from the mold cavities 20 using a continuous vacuum and injecting into the evacuated mold cavities 20 a liquid fed from a continuous source (not shown). The sliding of the injection head 14 over the mold plate 10, as shown in FIGS. 1B and 1C, automatically provides self valving for sequentially evacuating and filling the mold cavities 20 from the same side, i.e., the top side 18 of the mold plate 10. In a preferred embodiment, the vacuum slot 16 and the injection slot 22 are linked together at the mold plate 10 so that surface tension of the liquid restrains flow of the liquid (not shown) from the injection slot 22 to the vacuum slot 16 while allowing gas flow thereinbetween for effecting vacuum in the mold cavities 20.

As shown in FIG. 1A, at the start of the process, i.e., before scanning begins, the mold cavities 20 are empty. As the scanning process begins, as shown in FIG. 1B, some cavities 24 are evacuated. As the scanning of the injection head 14 continues, some cavities 26 are filled with the liquid. In the final step of the process, as shown in FIG. 1D, the vacuum supply to the vacuum slot 16 is turned off while the scanning of the injection head 14 is completed, i.e., all the cavities 20, 24 and 26 are filled with liquid.

The vacuum injection molding method illustrated in FIGS. 1A~1D applies a vacuum and a liquid injection on the same surface of the substrate. To enable the operation, a shallow vacuum link must be used to allow the continual evacuation of air from mold cavities that have a larger aspect ratio such as 5:1. The drawback of the process is that the vacuum link must be sufficiently shallow such that the surface tension of molten solder prevents cross-leaking during the operation. The shallow link chokes off a significant part of the full pressure differential and thus only produces partial filling of the mold cavities, or the via holes that have high aspect ratios.

It is therefore an object of the present invention to provide an apparatus for filling a liquid in high aspect ratio holes that does not have the drawbacks or shortcomings of the conventional apparatus.

It is another object of the present invention to provide an apparatus for filling a liquid in high aspect ratio holes in a substrate that applies a vacuum and a liquid injection on the opposite sides of a substrate.

It is a further object of the present invention to provide an apparatus for filling a liquid in high aspect ratio holes in a substrate by utilizing a filler plate and a vacuum plate sandwiching a substrate thereinbetween such that vacuum and liquid injection are applied on the opposite sides of the substrate.

It is another further object of the present invention to provide an apparatus for filling a molten solder in high aspect ratio via holes in an electronic substrate which is effective in filling holes that have aspect ratios of at least 5:1.

It is still another object of the present invention to provide an apparatus for filling a molten solder in high aspect ratio via holes in an electronic substrate wherein a filler plate and a vacuum plate are connected together and are further equipped with a veneer adjustment means such that a relative position of the two plates can be adjusted corresponding to the viscosity of the liquid injected.

It is yet another object of the present invention to provide an apparatus for filling a liquid in high aspect ratio holes in an electronic substrate by pulling vacuum and injecting molten solder simultaneously from and into the same holes when the liquid injected has high viscosity.

It is still another further object of the present invention to provide a method for filling high aspect ratio via holes in an electronic substrate by pulling a vacuum from via holes on a first side of the substrate and injecting liquid on the opposite side of the substrate into the via holes.

It is yet another further object of the present invention to provide a method for forming interconnects in a substrate for a display panel such that a voltage potential can be placed on pixel display elements formed on the display panel.

SUMMARY OF THE INVENTION

In accordance with the present invention, an apparatus and a method for filling high aspect ratio via holes in electronic substrates are provided.

In a preferred embodiment, an apparatus for filling a liquid in high aspect ratio holes in a substrate is provided which includes a filler plate adapted for receiving an injection head therein, the filler plate has a bottom surface adapted for receiving an injection slot provided on the injection head, a vacuum plate adapted for receiving a vacuum slot in a top surface, the vacuum slot is in fluid communication with a vacuum source, and a connection means for connecting the filler plate and the vacuum plate together in a face-to-face, spaced-apart relationship forming a gap thereinbetween with the bottom surface of the filler plate positioned parallel and opposite to the top surface of the vacuum plate, the connection means further includes an adjustment means for adjusting a relative axial position of the filler plate to the vacuum plate, the gap formed between the filler plate and the vacuum plate is sufficiently large to slidingly engaging a substrate therein and to form abutting contacts between the substrate and the bottom surface of the filler plate and between the substrate and the top surface of the vacuum plate so that holes in the substrate are first evacuated by the vacuum slot and then filled with a liquid by the injection slot in the filler plate.

In the apparatus for filling a liquid in high aspect ratio holes in a substrate, the adjustment means may include a veneer adjustment for fixing a relative axial position of the filler plate to the vacuum plate. The adjustment means may further include a veneer adjustment for transforming a circumferential displacement into a linear axial displacement. The filler plate may be positioned by the adjustment means to lag behind the vacuum plate such that the injection slot lags behind the vacuum slot. The filler plate may be positioned by the adjustment means at the same axial position of the vacuum plate such that the injection slot and the vacuum slot are in fluid communication with a hole in the substrate simultaneously.

In the apparatus for filling a liquid in high aspect ratio holes in a substrate, the injection slot may have a width sufficiently large to cover substantially all the high aspect ratio holes in the substrate. The injection head may be in fluid communication with a liquid reservoir for feeding a liquid through the injection slot. The injection slot may be adapted for feeding a high electrical conductivity liquid solder therethrough. The connection means may further include an adjustment means of a threaded veneer mechanically attached to the filler plate and at least one engagement pin connecting the threaded veneer to the vacuum plate. The high aspect ratio holes in the substrate are selected from the group consisting of via holes, deep through holes and deep trenches.

In the apparatus for filling a liquid in high aspect ratio holes in an electronic substrate, the high aspect ratio holes may have an aspect ratio of at least 5:1, or an aspect ratio of at least 20:1. The high aspect ratio holes may have a diameter not smaller than 5 $\mu$m. The electronic substrate may be adapted for making sliding movement between the filler plate and the vacuum plate at a speed of between about 25 mm/min and about 250 mm/min. The apparatus may further include a drive means slidingly engaging the substrate between the filler plate and the vacuum plate.

The present invention is further directed to a method for filling a liquid into holes that have aspect ratios of larger than 5:1 in a substrate which can be carried out by the operating steps of providing a substrate that is equipped with a plurality of through holes that have aspect ratios of larger than 5:1, each of the plurality of through holes has a first opening on a first surface of the substrate and a second opening on an opposite second surface of the substrate, contacting the first surface of the substrate with a vacuum plate equipped with a vacuum slot such that air is evacuated from the first opening of each of the plurality of through holes, and contacting the second surface of the substrate with a filler plate equipped with an injection slot such that a liquid can be injected into the second opening of each of the plurality of through holes which was evacuated by the vacuum plate.

The method for filling a liquid into holes that have aspect ratios of larger than 5:1 in a substrate may further include the step of contacting the first surface of the substrate with a vacuum plate and contacting the second surface of the substrate with a filler plate simultaneously. The method may further include the step of connecting the vacuum plate to the filler plate by a connection means which further includes an adjustment means of a veneer adjuster. The method may further include the step of adjusting the veneer adjuster such that the injection slot lags behind the vacuum slot when a substrate is slidingly displaced inbetween the filler plate and the vacuum plate. The method may further include the step of slidingly engaging a substrate between the filler plate and the vacuum plate, or slidingly moving a substrate inbetween the filler plate and the vacuum plate by a motor means, or the step of slidingly moving the substrate inbetween the filler plate and the vacuum plate at a speed between about 25 mm/min and about 250 mm/min.

The method for filling a liquid into high aspect ratio holes in a substrate may further include the step of covering substantially all the through holes in the substrate by the injection slots situated in the filler plate when the substrate is placed between the filler plate and the vacuum plate. The method may further include the step of connecting the vacuum plate to the filler plate in such a way that the vacuum plate is situated below the filler plate. The method may further include the step of providing a pressurized liquid reservoir in fluid communication with the injection slot, or the step of feeding a liquid to the injection slot in the filler plate from a liquid reservoir.

The method may further include the steps of feeding a molten solder in a liquid form to the injection slot in the filler plate, injecting the molten solder into the through holes, and solidifying the molten solder and forming via contacts. The method may further include the step of connecting a vacuum evacuation source to the vacuum slot in the vacuum plate such that air is evacuated from the first opening of each of the plurality of through holes.

In another preferred embodiment, the present invention provides an apparatus for filling an electrically conductive material into high aspect ratio holes in an electronic substrate which includes a first plate equipped with an injection slot for delivering an electrically conductive material, a second plate equipped with a vacuum slot for evacuating air, means for fixing the first and second plates together in a parallely face-to-face, spaced-apart relationship forming a dispensing unit for intimately engaging an electronic substrate therein, the electronic substrate may have holes with aspect ratios larger than 5:1 therein and the holes are in fluid communication with the injection slot and the vacuum slot when intimately engaged between the first and second plates, and drive means for causing sliding engagement and relative motion between the dispensing unit and an electronic substrate positioned therein.

In the apparatus for filling an electrically conductive material into high aspect ratio holes, the apparatus may further include an electrically conductive material reservoir for feeding the material into the injection slot. The apparatus may further include vacuum evacuation means for withdrawing air from the vacuum slot. The fixing means may further include adjustment means for adjusting a relative position of the first plate to the second plate, the adjustment means may be a veneer adjuster. The injection slot in the first plate may be adjusted behind the vacuum slot in the second plate, or the injection slot in the first plate may be adjusted to the same axial position of the vacuum slot in the second plate. The electrically conductive material delivered may be a molten solder at the lower end of the viscosity range, or a conductive polymer at the higher end of the viscosity range. The drive means drives the electronic substrate and cause it to slide between the first and second plates. The drive means may be a motor means.

The present invention is still further directed to a method for forming interconnects in a substrate for a display panel which can be carried out by the steps of first providing a substrate for a display panel that has a plurality of interconnect holes therein, each of the plurality of interconnect holes may have a first opening on a first surface of the substrate and a second opening on an opposite second surface of the substrate, withdrawing air from the plurality of interconnect holes by contacting the holes at the first opening with a vacuum slot provided on a vacuum plate, and filling the plurality of interconnect holes with a molten solder by contacting the holes at the second opening with an injection slot provided on a filler plate.

In the method for forming interconnects in a substrate for a display panel, the method may further include the step of solidifying the molten solder in the plurality of interconnect holes and forming the interconnects. The method may further include the step of contacting the plurality of interconnect holes with the vacuum slot and the injection slot simultaneously. The method may further include the step of forming the interconnects and placing a voltage potential on pixel display elements formed on the display panel. The method may further include the step of mounting the vacuum plate and the injection plate together in a parallelly face-to-face, spaced-apart relationship with a cavity formed therein for slidingly engaging the substrate in abutting contact. The method may further include the step of adjusting a relative axial position of the vacuum plate to the injection plate, wherein the adjustment means may be a veneer adjuster. The method may further include the step of feeding a molten solder to the injection slot from a molten solder reservoir.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for filling high aspect ratio holes in electronic substrates which can be advantageously used for forming via contacts, interconnects or trenches in various electronic structures including but not limited to substrates for display panels.

The present invention further discloses structures formed by the present invention novel method and apparatus which have high aspect ratio through holes filled with a conductive material such as a conductive polymer or an eutectic solder for providing electrical communication in an insulating substrate.

The present invention novel method may be advantageously used to fill deep, high aspect ratio through holes such as those having aspect ratios of larger than 5:1, or larger than 20:1. The present invention novel method can further be used to fill holes with diameters as small as 10 $\mu$m, or as small as 5 $\mu$m. In the conventional method, through holes having diameters of smaller than 100 $\mu$m are difficult to fill with a conductive material for forming vias or interconnects.

The present invention provides a novel method for injecting an electrically conductive material into via or interconnect holes that have very high aspect ratios. The method is a dry processing technique and therefore retains the advantages of low-cost methods such as paste screening. The method is able to fill via holes that have diameters of 10 $\mu$m or larger and aspect ratios of 5:1 or larger. The method is made possible by utilizing several novel features such that reliable filling of very deep via or interconnect holes can be achieved. These novel features include the use of a large pressure differential between a filler material supply and the via holes, positive pressure from the top of the via holes fed from a filler reservoir and a vacuum from the bottom of the via holes from an evacuation means, an adjustable veneer position arranged between the pressurized supply and vacuum to accommodate various filler viscosities, and a scanning fill method to accommodate a wide range of via hole array sizes and to ensure fill control.

Figure 1A:
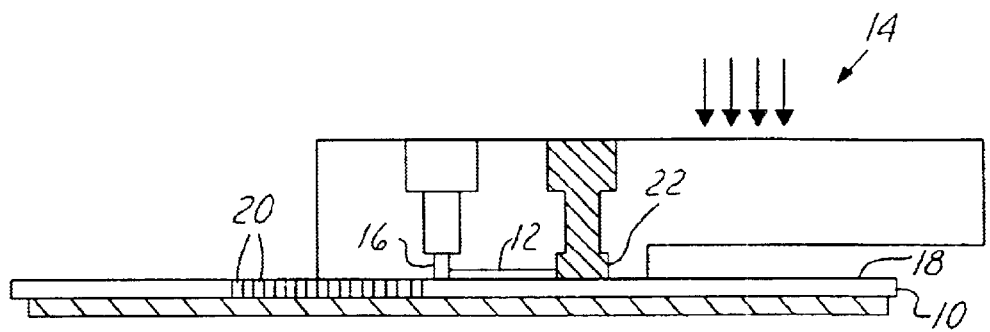
FIGS. 1A–1D are graphs illustrating a vacuum injection molding process wherein a vacuum head and an injection head are mounted on the same surface of a substrate.
Figure 1B:
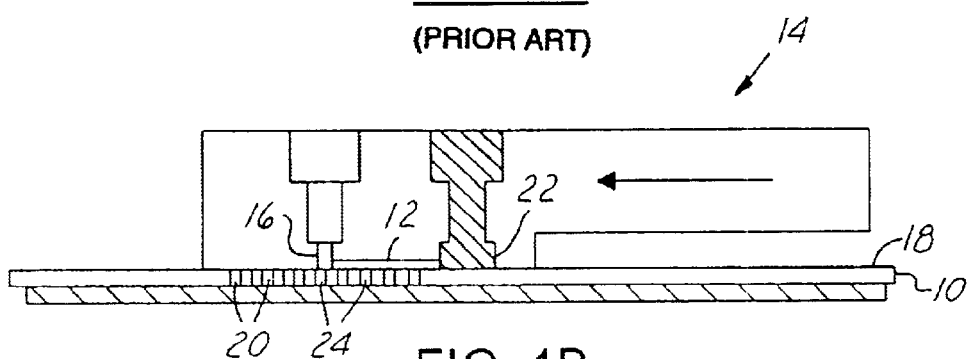
Figure 1C:
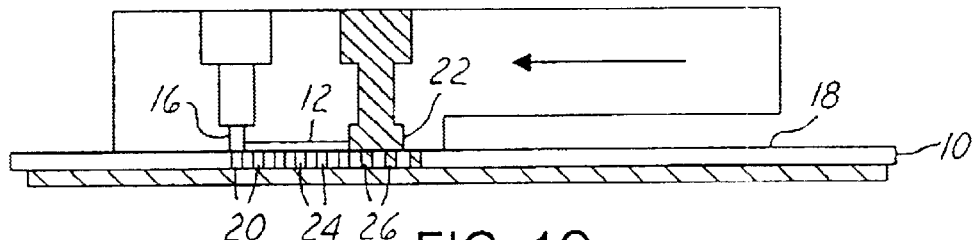
Figure 1D:
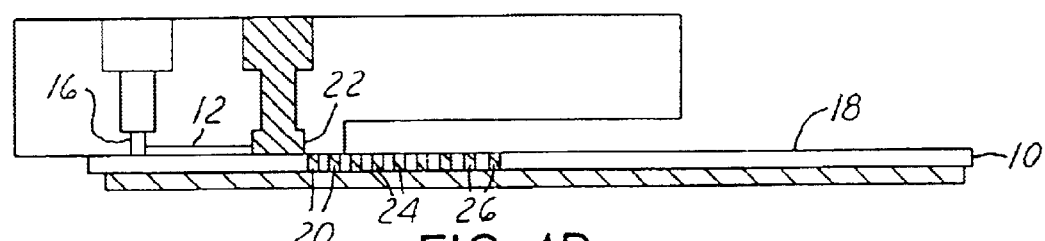
Figure 2:
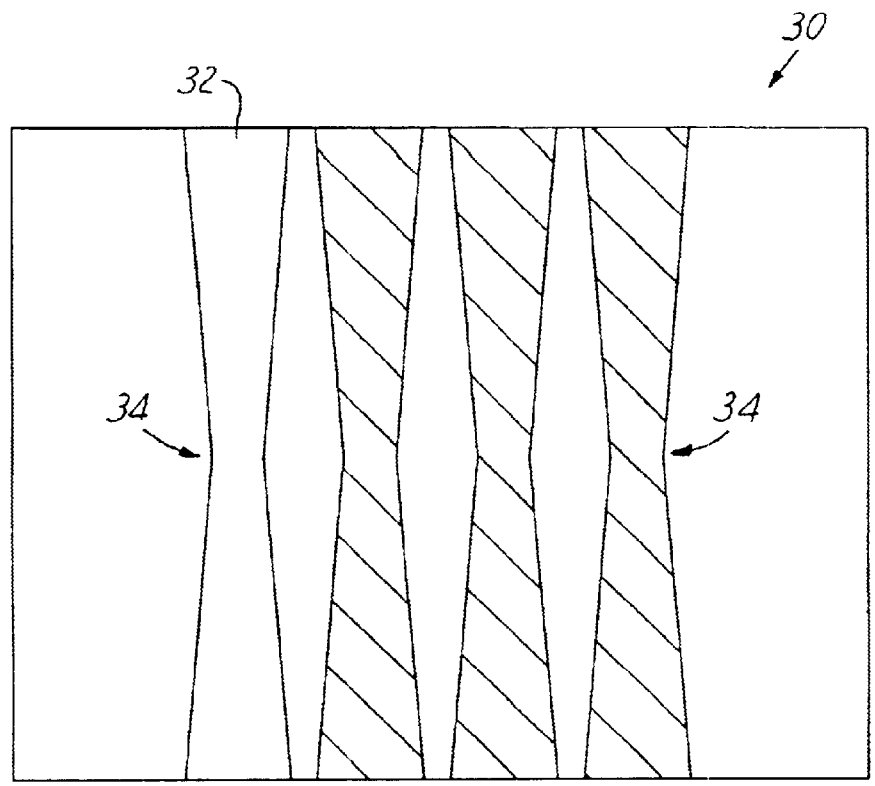
FIG. 2 is an enlarged, cross-sectional view of a substrate having through holes of 17:1 aspect ratio.

Referring initially to FIG. 2, wherein an enlarged, cross-sectional view of a substrate 30 having via holes 32 with high aspect ratios is shown. It should be noted that the via holes 32 are formed in a tapered shape in FIG. 2. However, the present invention novel method is not limited for filling such tapered holes. Holes that have a straight opening may be similarly filled by the present invention novel method. As shown in FIG. 2, the narrow center portion 34 of the via hole 32 has a diameter of approximately 30 $\mu$m while the spacing between the holes is approximately 20 $\mu$m. The via holes 32 has a length of approximately 500 $\mu$m and therefore making an aspect ratio of about 17:1. It has been found that while a conventional injection molded solder process may be effective in filling via holes that have aspect ratios up to 5:1 and a hole diameter of larger than 100 $\mu$m, the present invention novel method is capable of filling via holes that have aspect ratios between 5:1 and 30:1, and have diameters between about 5 $\mu$m and about 125 $\mu$m.

Figure 3A:
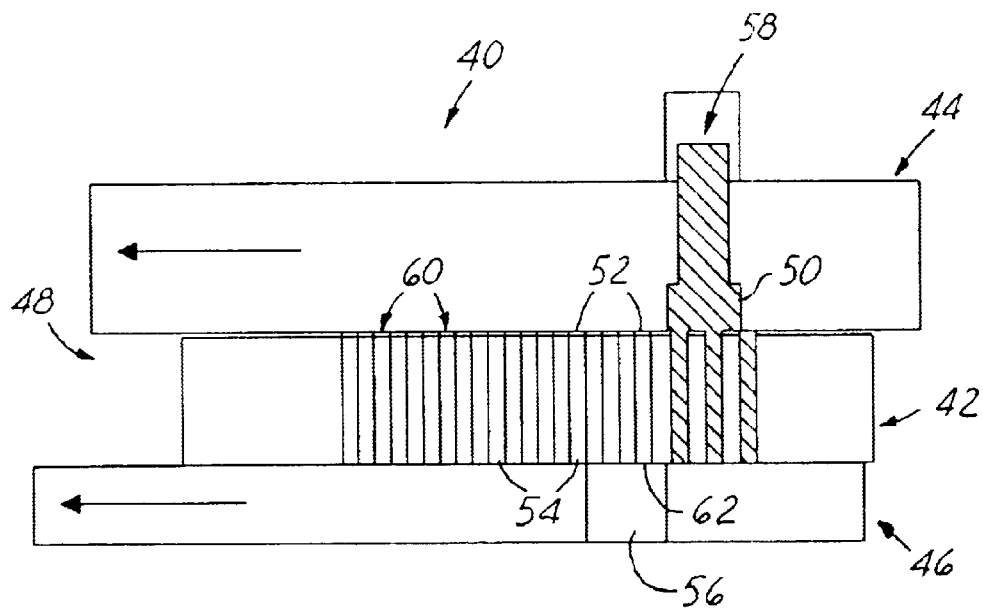
FIGS. 3A–3B are cross-sectional views illustrating the present invention apparatus in operation.
Figure 3B:
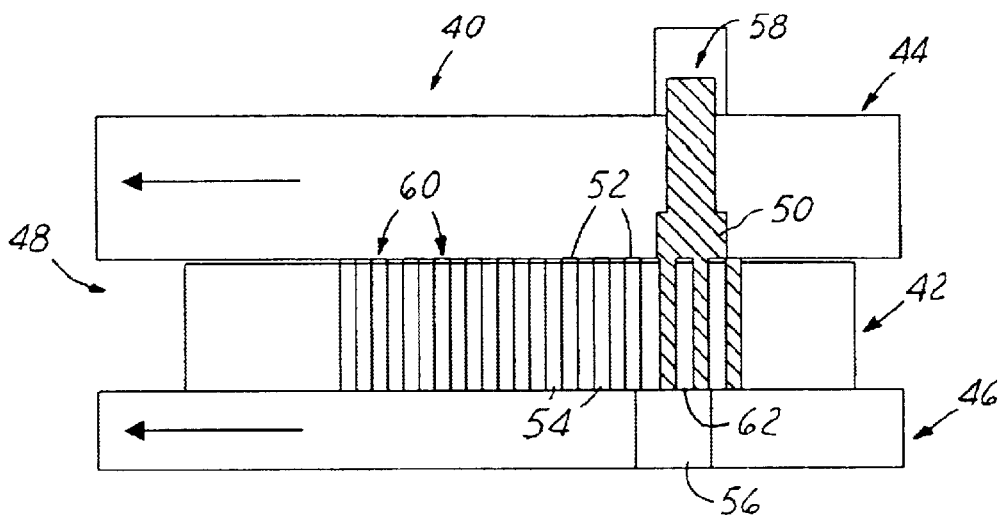

Referring now to FIGS. 3A and 3B wherein cross-sectional views of the present invention apparatus 40 is shown. As can be seen in FIGS. 3A and 3B, the present invention novel method overcomes the shortcomings of the conventional IMS method by utilizing several novel features. First, there are two supplies, i.e., a vacuum supply and an injection supply that are simultaneous scanned below and above the stationary via array substrate 42. It should also be noted that the set-up shown in FIGS. 3A and 3B is more suited for a laboratory test arrangement. While in a fabrication plant, the filler plate 44 and the vacuum plate 46 are more likely be held in a stationary position while the via array substrate 42 is scanned through a gap 48 formed inbetween the two plates 44, 46. Since the pressurized filler 50 is supplied to a top opening 52 of the via holes 60 while the vacuum is supplied to the bottom opening 54 of the via holes 60, the full pressure differential is produced across the via holes. Since each supply, i.e., the pressure and the vacuum, may be separately adjusted, a wide range of total pressure differentials can be achieved. The wide range of total pressure differential may be further utilized in conjunction with an adjustable veneer position range shown in FIGS. 4A and 4B.

As shown in FIGS. 3A and 3B, the present invention novel method allows for the precise positioning of both supplies, i.e., the pressure and the vacuum, relative to each other. For example, FIG. 3A shows the vacuum supply 56 in front of the pressurized filler supply 58 and therefore, in a leading or non-overlapping position. FIG. 3B shows the vacuum supply 56 is only slightly ahead of the pressurized filler supply 58, and thus in a leading and overlapping position. Each of the relative positions has its own unique applications depending on the materials utilized and the geometries of the via holes. A third main position configuration (not shown) is that of the vacuum supply 56 and the pressurized filer supply 58 being at the same position, and thus in an equal and overlapping position. This third position would be suitable for dispensing the highest viscosity filler materials.

The filler plate/vacuum plate configuration shown in FIG. 3A can be suitably used for lower viscosity materials, such as molten solder. In this configuration, there is no overlapping between the scanning vacuum and the pressurized filler supplies. This ensures that the evacuated via holes 60 (shown in shaded sections) back-fill with molten solder 50 without allowing the solder to escape through the vacuum slot 62. Furthermore, the position between both supplies 56, 58 can be precisely preset such that at a certain scanning speed, i.e., between about 25 mm/min and about 250 mm/min, the vacuum does not bleed away before the molten solder fully penetrates the via holes 60. The position setting shown in FIG. 3B, on the other hand, can be suitably used for materials with higher viscosities. In this configuration, there is some overlap between the vacuum and the pressurized filler supplies 56, 58. This permits the greatest pressure differential, depending on each supply setting, to be produced across each via hole 60 for a longer time period. Depending on the scanning speed, this configuration can be used to fill deep via holes with high-viscosity materials such that longer time is available for penetrating the holes. In the configuration shown in FIG. 3B, it is further possible for some of the via filling material 50 to slightly enter the vacuum slot 62 once each via hole is completely filled. However, due to the scanning motion of both the filler and the vacuum supplies 56, 58, this can be kept to a minimum required to confirm complete filling. In effect, the scanning motion essentially "freezes", or confines the filler material 50 within the vias 60 as they are sequentially filled and then sealed by the passing slots.

Figure 4A:
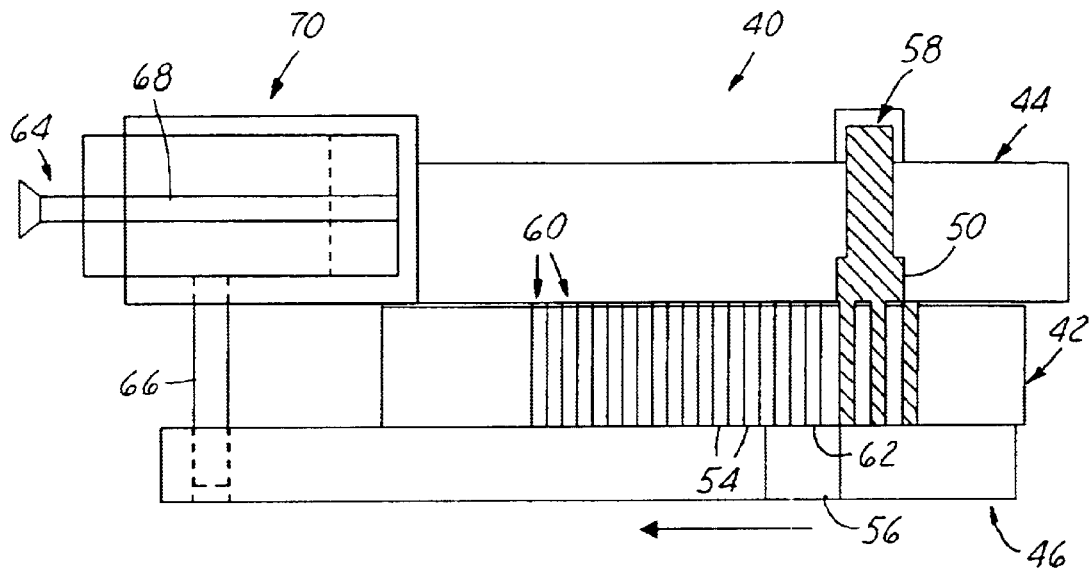
FIGS. 4A and 4B are cross-sectional views of the present invention apparatus further equipped with veneer adjustment means.
Figure 4B:
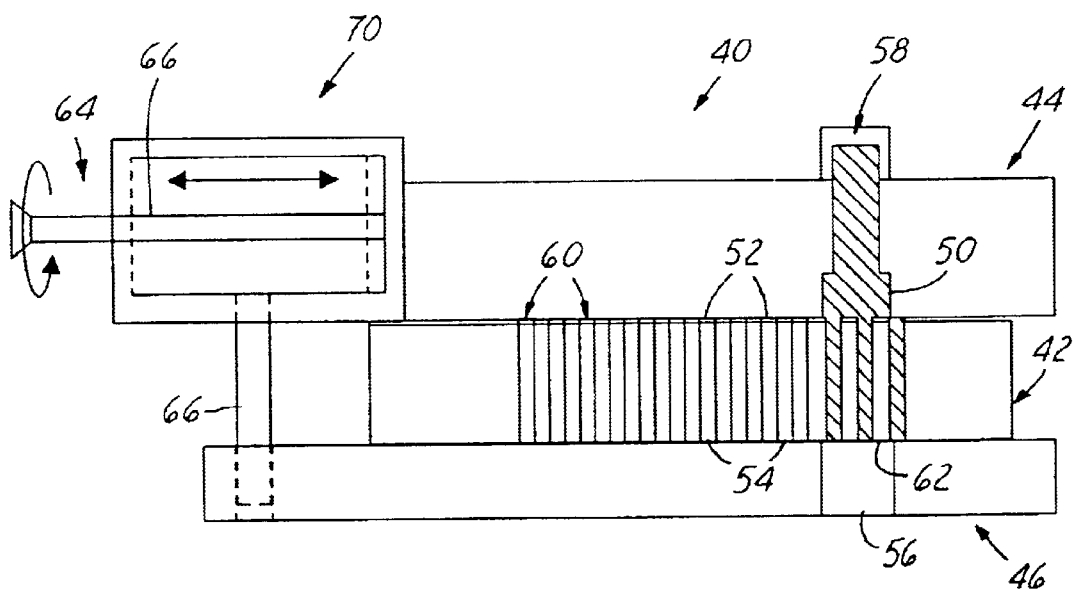

In another configuration shown in FIGS. 4A and 4B, the scanning motion is produced by a mechanical actuator 70 which is connected to the filler supply plate 44 and the motion is transferred to the vacuum supply plate 46 through the engagement pin 66 shown in FIG. 4A. The precise positioning of the via filler supply 50 in reference to the vacuum supply 56 is achieved through a veneer positioning adjustment 64 that locks in the relative positions of the supply plate 44 and the vacuum plate 46. This precise control is another benefit made possible by the present invention novel apparatus which can be used to accommodate via filling material 50 of various viscosities.

A threaded veneer rod 68 is utilized in the threaded veneer adjuster 64, shown in FIG. 4A, which when turned transforms a circumferential motion of the veneer rod 68 into a linear displacement motion of the filler plate 44. As a result, a slight change in the vacuum supply plate 46 position and its corresponding vacuum slot 62 from the adjustment position 1 to the adjustment position 2 shown in FIGS. 4A and 4B, respectively. The engagement pin 66 provides a mechanical link between the filler supply plate 44 and the vacuum supply plate 46. Normally both plates move in exact unison as they are scanned in reference to the stationary via array substrate 42. Again, it should be emphasized that in a fabrication plant, it is more convenient and desirable to move the via array substrate 42 while keeping the filler supply plate 44 and the vacuum supply plate 46 in a stationary position. During veneer adjustment, only one plate is adjusted slightly in position with reference to the other plate through the engagement pin 66. It is obvious that the mechanical actuator 70 can be connected to either plate.

Figure 5A:
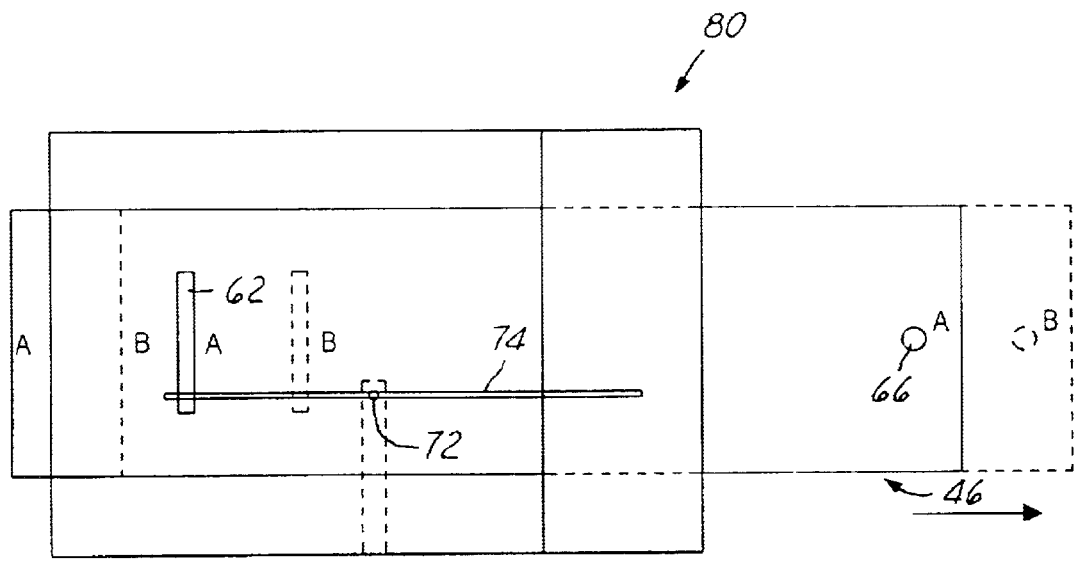
FIGS. 5A and 5B are a plane view and a cross-sectional view of the present invention coating apparatus.
Figure 5B:
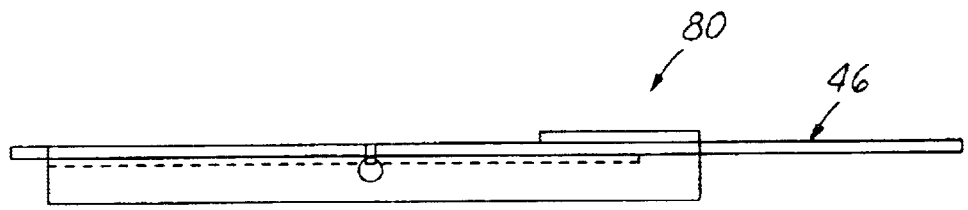

FIGS. 5A and 5B show the fixturing 80 that is required to supply a movable vacuum slot 62 and a method for assuring that the via array substrate 42 remains stationary during the scanning operation. A vacuum supply port 72 may be connected to a vacuum source through a hose. The vacuum supply port 72 in turn is connected in the fixture to a vacuum supply channel 74, while the top surface of which is exposed. The movable vacuum plate 46 covers the vacuum supply channel 74 except for the area of the vacuum slot 62. This enables the scannable vacuum slot 62 as a continuous vacuum source that is readily available. It should be noted that while FIGS. 5A and 5B show one specific embodiment of the vacuum plate/filler plate/via array substrate arrangement, it is not intended to limit the scope of the present invention novel apparatus and method.

While the present invention novel apparatus and method can be used to fill any type of substrates that are provided with high aspect ratio holes, it is particularly suited for filling deep, high aspect ratio via holes in substrates such as glass, silicon, plastic laminates, etc. Typical uses of via holes in these substrates include providing electrically conductive paths from one side of the substrate to the opposite side of the substrate. Such a suitable substrate may be glass when used in a display panel application. When the substrates are silicon, they can be used to fabricate integrated circuits for processors and memory devices. Substrates that are made of plastic laminates are typically for making high performance (multiple conductive layers separated by insulating layers) carriers that support silicon devices. In such applications, the combination of silicon device mounted on a high performance carrier results in an electronic package that can be utilized in many applications, such as PC's, telecommunications, electronic modules for automobiles, etc.

Figure 6A:
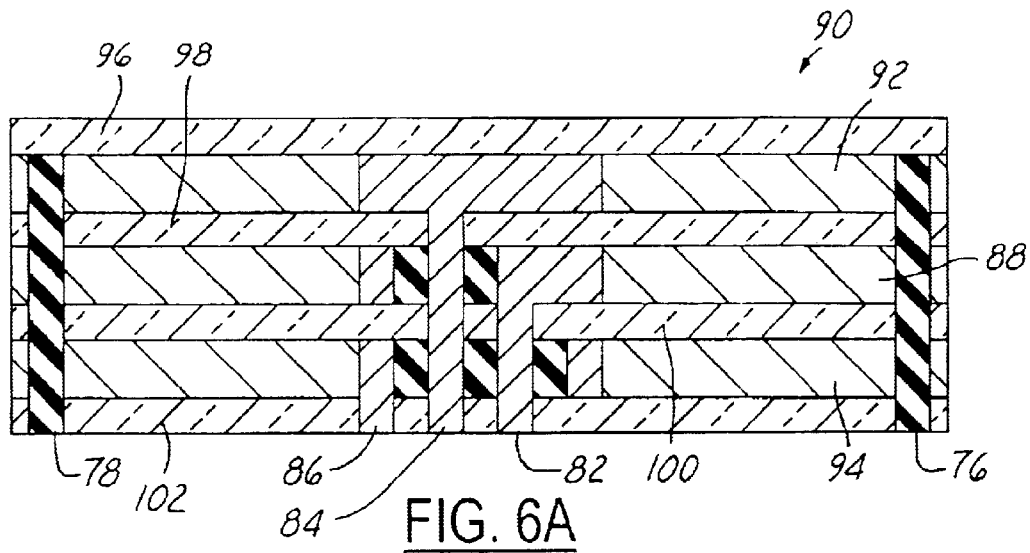
FIGS. 6A and 6B are a cross-sectional view and a plane view of a interconnect in a liquid crystal display panel formed by the present invention method.
Figure 6B:
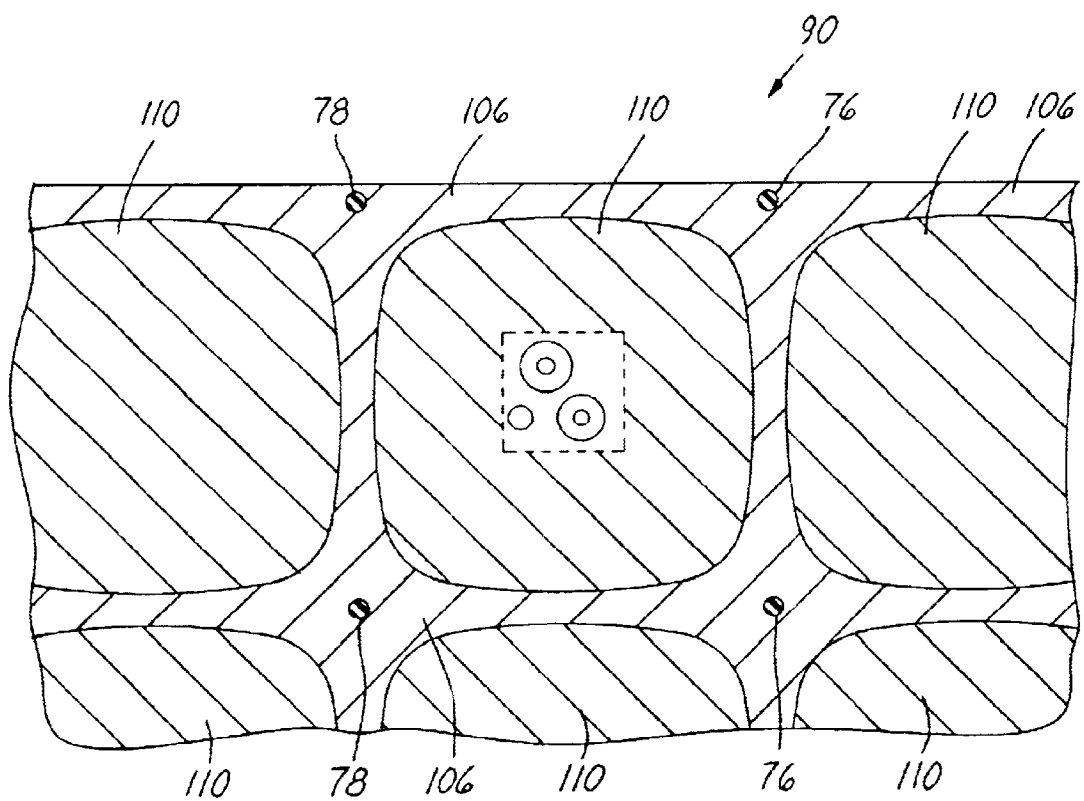

FIGS. 6A and 6B illustrate a cross-sectional view and a plane view of interconnects, respectively in a liquid crystal display panel 90 formed by the present invention method. The interconnects formed include that for the ground conductors 76, 78 and that for the blue, green and red regions 82, 84 and 86 in the liquid crystal display panel 90, respectively. The interconnects 82, 84 and 86 provide a voltage potential on the pixel display elements blue, green and red in the liquid crystal layers 88, 92 and 94, respectively. It is seen in FIG. 6A that the liquid crystal layers 88, 92 and 94 are separated by glass plates 96, 98, 100 and 102, respectively.

The plane view of the liquid crystal display, shown in FIG. 6B, illustrates a plurality of pixels 110 each including the blue, green and red regions that are powered by the interconnects 82, 84 and 86 formed by the present invention novel method. The ground conductors 76, 78 are connected to the ground plane 106. It should be noted that FIGS. 6A and 6B merely illustrate one possible embodiment of a display panel that has interconnects formed by the present invention novel method. The invention may be equally advantageously applied to other possible configurations of interconnects utilized in other types of display panels, i.e., field emission display panels, electro-reflective display panels, etc.

The present invention novel apparatus and method for filling high aspect ratio via holes in electronic substrates have therefore been amply described in the above descriptions and in the appended drawings of FIGS. 2~5B.

While the present invention has been described in an illustrative manner, it should be understood that the terminology used is intended to be in a nature of words of description rather than of limitation.

Furthermore, while the present invention has been described in terms of a preferred and two alternate embodiments thereof, it is to be appreciated that those skilled in the art will readily apply these teachings to other possible variations of the invention.

The embodiment of the invention in which an exclusive property or privilege is claimed are defined as follows:

What is claimed is:

1. A method for filling a liquid into holes having aspect ratios of larger than 5:1 in a substrate comprising the steps of:
   providing a substrate equipped with a plurality of through holes having aspect ratios of larger than 5:1,
   each of said plurality of through holes having a first opening on a first surface of said substrate and a second opening on an opposite second surface of the substrate,
   contacting said first surface of the substrate with a vacuum plate equipped with a vacuum slot such that air being evacuated from said first opening of each of said plurality of through holes, and
   contacting said second surface of the substrate with a filler plate equipped with an injection slot such that a liquid is injected into said second opening of each of said plurality of through holes which are evacuated by said vacuum plate.

2. A method for filling a liquid into holes having aspect ratios of larger than 5:1 in a substrate according to claim 1 further comprising the step of contacting said first surface of the substrate with a vacuum plate and contacting said second surface of the substrate with a filler plate simultaneously.

3. A method for filling a liquid into holes having aspect ratios of larger than 5:1 in a substrate according to claim 1 further comprising the step of connecting said vacuum plate to said filler plate by a connection means which further comprises an adjustment means of a veneer adjuster.

4. A method for filling a liquid into holes having aspect ratios of larger than 5:1 in a substrate according to claim 3 further comprising the step of adjusting said veneer adjuster such that said injection slot lags behind said vacuum slot when a substrate is slidingly displaced inbetween the filler plate and the vacuum plate.

5. A method for filling a liquid into holes having aspect ratios of larger than 5:1 in a substrate according to claim 3 further comprising the step of slidingly engaging a substrate inbetween said filler plate and said vacuum plate.

6. A method for filling a liquid into holes having aspect ratios of larger than 5:1 in a substrate according to claim 3 further comprising the step of slidingly moving a substrate inbetween said filler plate and said vacuum plate by a motor means.

7. A method for filling a liquid into holes having aspect ratios of larger than 5:1 in a substrate according to claim 6 further comprising the step of slidingly moving said substrate inbetween said filler plate and said vacuum plate at a speed between about 25 mm/min and about 250 mm/min.

8. A method for filling a liquid into holes having aspect ratios of larger than 5:1 in a substrate according to claim 1 further comprising the step of covering substantially all the through holes in said substrate by said injection slot situated in said filler plate when said substrate is placed inbetween said filler plate and said vacuum plate.

9. A method for filling a liquid into holes having aspect ratios of larger than 5:1 in a substrate according to claim 1 further comprising the step of connecting said vacuum plate to said filler plate in such a way that said vacuum plate is situated below said filler plate.

10. A method for filling a liquid into holes having aspect ratios of larger than 5:1 in a substrate according to claim 1 further comprising the step of providing a pressurized liquid reservoir in fluid communication with said injection slot.

11. A method for filling a liquid into holes having aspect ratios of larger than 5:1 in a substrate according to claim 1 further comprising the step of feeding a liquid to said injection slot in said filler plate from a liquid reservoir.

12. A method for filling a liquid into holes having aspect ratios of larger than 5:1 in a substrate according to claim 1 further comprising the steps of:
   feeding a molten solder in a liquid form to said injection slot in said filler plate,
   injecting said molten solder into said plurality of through holes, and
   solidifying said molten solder and forming via contacts.

13. A method for filling a liquid into holes having aspect ratios of larger than 5:1 in a substrate according to claim 1 further comprising the step of connecting a vacuum evacuation source to said vacuum slot in said vacuum plate such that air is evacuated from said first opening of each of said plurality of through holes.

14. A method for forming interconnects in a substrate for a display panel comprising the steps of:

providing a substrate for a display panel having a plurality of interconnect holes each having a first opening on a first surface of said substrate and a second opening on an opposite second surface of said substrate, withdrawing air from said plurality of interconnect holes by contacting said holes at said first opening with a vacuum slot provided in a vacuum plate, and filling said plurality of interconnect holes with a molten solder by contacting said holes at said second opening with an injection slot provided in a filler plate.

15. A method for forming interconnects in a substrate for a display panel according to claim 14 further comprising the step of solidifying said molten solder in said plurality of interconnect holes and forming said interconnects.

16. A method for forming interconnects in a substrate for a display panel according to claim 14 further comprising the step of contacting said plurality of interconnect holes with said vacuum slot and said injection slot simultaneously.

17. A method for forming interconnects in a substrate for a display panel according to claim 14 further comprising the step of forming said interconnects and placing a voltage potential on pixel display elements formed in said display panel.

18. A method for forming interconnects in a substrate for a display panel according to claim 14 further comprising the step of mounting said vacuum plate and said injection plate together in a parallelly face-to-face, spaced-apart relationship with a cavity formed therein for slidingly engaging said substrate in an abutting contact.

19. A method for forming interconnects in a substrate for a display panel according to claim 18 further comprising the step of adjusting a relative axial position of said vacuum plate to said injection plate by an adjustment means.

20. A method for forming interconnects in a substrate for a display panel according to claim 19, wherein said adjustment means is a veneer adjuster.

21. A method for forming interconnects in a substrate for a display panel according to claim 14 further comprising the step of feeding a molten solder to said injection slot from a molten solder reservoir.

* * * * *